United States Patent
Yoshida

(10) Patent No.: US 7,663,303 B2
(45) Date of Patent: Feb. 16, 2010

(54) ORGANIC ELECTROLUMINESCENT DEVICE AND DISPLAY APPARATUS USING THE SAME

(75) Inventor: Shigeki Yoshida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 343 days.

(21) Appl. No.: 11/676,672

(22) Filed: Feb. 20, 2007

(65) Prior Publication Data
US 2007/0228939 A1    Oct. 4, 2007

(30) Foreign Application Priority Data
Mar. 30, 2006    (JP) .............................. 2006/094555

(51) Int. Cl.
*H05B 33/00*    (2006.01)

(52) U.S. Cl. .................. 313/504; 313/502; 313/506; 428/690; 428/917

(58) Field of Classification Search ......... 313/495–512; 315/169.1, 169.3, 169.4; 428/690–691, 917; 438/26–29, 34, 82; 257/40, 72, 79, 98–100, 257/642–643, 759; 427/66, 532–535, 539
See application file for complete search history.

(56) References Cited

U.S. PATENT DOCUMENTS

| 6,091,196 | A  | * | 7/2000 | Codama ..................... 313/504 |
| 7,078,114 | B2 | * | 7/2006 | Seo et al. .................... 428/690 |
| 2005/0212416 | A1 | * | 9/2005 | Seo et al. .................... 313/504 |
| 2007/0126347 | A1 | * | 6/2007 | Jarikov et al. ............... 313/506 |
| 2007/0215865 | A1 | * | 9/2007 | Liu et al. ...................... 257/40 |

FOREIGN PATENT DOCUMENTS

JP    2004-155711    6/2004

OTHER PUBLICATIONS

R. Antony et al., Appl. Phys. B 71, pp. 33-41 (2000).*

* cited by examiner

*Primary Examiner*—Karabi Guharay
*Assistant Examiner*—Brenitra M Lee
(74) *Attorney, Agent, or Firm*—Fitzpartick, Cella, Harper & Scinto

(57) ABSTRACT

An organic electroluminescent device having a pair of electrodes and a luminescent layer including an organic compound interposed between the pair of electrodes. The luminescent layer contains at least one element selected from the group consisting of argon, krypton, xenon and radon.

8 Claims, 3 Drawing Sheets

ORGANIC ELECTROLUMINESCENT DEVICE AND DISPLAY APPARATUS USING THE SAME

BACKGROUND OF THE INVENTION

1. Field of the Invention

The present invention relates to a novel organic luminescent device.

2. Description of the Related Art

An organic electroluminescent device includes a thin film containing a fluorescent organic compound or a phosphorescent organic compound interposed between an anode and a cathode. Electrons and holes (positive holes) are injected from the electrodes into the thin film to form excitons of the fluorescent compound or the phosphorescent compound. The organic electroluminescent device utilizes the light emitted when the excitons return to the ground state.

Such organic electroluminescent devices have been studied actively.

Organic electroluminescent devices need an optical output of higher brightness or higher conversion efficiency, and these subjects are intensively studied. However, further improvement of organic electroluminescent devices is desirable in terms of durability such as change with time due to prolonged use and deterioration due to an atmospheric gas containing oxygen, moisture or the like.

It is believed that, even when a uniform amorphous film is formed at first, intermolecular interaction gradually causes crystallization or aggregation therein, leading to a change with time. Japanese Patent Application Laid-Open No. 2004-155711 discloses a technique to reduce the intermolecular interaction by coupling organic molecules at the respective ends using a molecular chain of an alkyl group, thereby providing a steric hindrance structure to the organic molecules.

Moreover, blue, green and red light emissions with higher color purity are necessary for applications to a full-color display or the like, but these problems are not yet sufficiently solved.

SUMMARY OF THE INVENTION

It is an object of the present invention to provide an organic electroluminescent device showing only a slight change with time.

More specifically, it is an object of the present invention to provide an organic electroluminescent device having an optical output of extremely high efficiency and high brightness.

The present invention provides an organic electroluminescent device including a pair of electrodes and a luminescent layer including an organic compound interposed between the pair of electrodes, wherein the luminescent layer contains at least one element selected from the group consisting of argon, krypton, xenon and radon.

Further, the present invention provides a display apparatus including such an organic electroluminescent device in a display portion.

It is possible to improve the durability of the organic electroluminescent device by introducing an inert gas into the luminescent layer so that the intermolecular force between organic compounds composing the luminescent layer is reduced.

Further features of the present invention will become apparent from the following description of exemplary embodiments with reference to the attached drawings.

DESCRIPTION OF THE EMBODIMENTS

Figure 1:
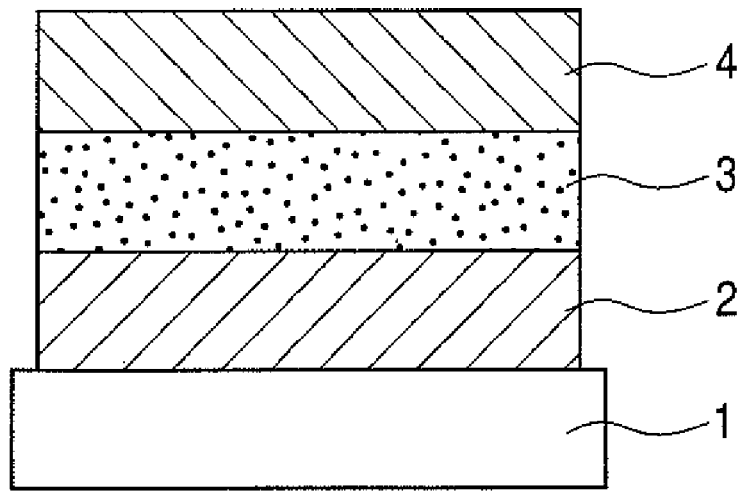
FIG. 1 is a sectional view illustrating an embodiment of an organic luminescent device according to the present invention.

The organic electroluminescent device (organic luminescent device) according to the present embodiment is an organic electroluminescent device including a pair of electrodes and a luminescent layer including an organic compound interposed between the pair of electrodes, wherein the luminescent layer contains at least one element selected from the group consisting of argon, krypton, xenon and radon.

It is possible to reduce the intermolecular force between the organic compounds composing the luminescent layer if such an element (argon, krypton, xenon and radon, hereinafter referred to as "any of these elements") is contained in the luminescent layer.

As a result, it is possible to prevent aggregation of organic compounds, thereby preventing deterioration with time of the organic electroluminescent device.

The elements may be introduced into the luminescent layer when the luminescent layer is formed (film is deposited).

Any of these elements in the luminescent layer may have a uniform concentration. Alternatively, any of these elements may have a distributed concentration, because a non-uniform distribution of concentration of any of these elements in the luminescent layer may cause these elements to diffuse within the layer so as to be uniform, which is effective to prevent aggregation of organic molecules.

Any of these elements is preferably contained in an amount of 0.01 atom % or more and of 5 atom % or less based on the amount of carbon in an organic compound composing the luminescent layer.

The organic electroluminescent device according to the present embodiment is characterized by containing any of these elements in the luminescent layer and may contain a plurality of any of these elements.

Further, in the organic electroluminescent device according to the present embodiment, any of these elements may also be contained in a hole transport layer, an electron injection/transport layer, an anode and a cathode, which are described later.

Any of these elements contained in the luminescent layer is preferably of the same type as that contained in other organic compound layers and electrodes but may be of a different type.

The organic electroluminescent device of the present invention may be used in a display portion of a display apparatus, and the display apparatus has a holding unit for holding the organic electroluminescent device in an airtight state. A holding space of the holding unit may be filled with a gas containing any of these elements.

The gas is preferably of the same type of element as any of these elements contained in the components (for example, electrodes and organic compound layers including a luminescent layer) composing the organic electroluminescent device. Of course, the gas may be of a different type.

In the organic electroluminescent device according to the present embodiment, the organic compound layers, including the luminescent layer as an example, interposed between a pair of electrodes may be formed by a vacuum deposition method, an ionization deposition method, sputtering, plasma or a known coating method (e.g., spin coating, dipping, a casting method, an LB method, an inkjet method or the like) while being dissolved in an appropriate solvent.

When a vapor phase deposition method is selected from the above-described methods for forming the organic compound layers, various procedures can be used for introducing any of these elements into the organic compound layers.

Three of these procedures are listed below:

(1) A procedure in which an inert gas of any of these elements is introduced into a film deposition chamber and an organic compound layer is formed while keeping the partial pressure of the inert gas in the film deposition environment at a constant pressure;

(2) A procedure in which a differential exhaust mechanism is provided between a substrate and a deposition source to increase the partial pressure of an inert gas only in the vicinity of the substrate for depositing an organic compound; and (3) A procedure in which an inert gas is ionized (may be simply ionized or converted to cluster ions) to cause ion beams and co-deposited with an organic compound composing the organic compound layer.

A hole transport layer and an electron injection/transport layer other than the luminescent layer can be prepared by any of the above procedures, and these procedures can also be used for introducing any of these elements into these layers.

FIGS. 1 to 5 illustrate preferred embodiments of the organic luminescent device of the present invention.

Symbols in these figures are described as follows:

1: substrate, 2: anode, 3: luminescent layer, 4: cathode, 5: hole transport layer, 6: electron transport layer, 7: hole injection layer and 8: hole/exciton blocking layer.

FIG. 1 is a sectional view illustrating an embodiment of an organic electroluminescent device according to the present invention. FIG. 1 illustrates a structure in which an anode 2, a luminescent layer 3 and a cathode 4 are formed in this order on a substrate 1. The organic electroluminescent device used herein is useful in the case where a single organic compound has hole transport properties, electron transport properties and luminescent properties or where organic compounds each having these properties are used in combination.

Figure 2:
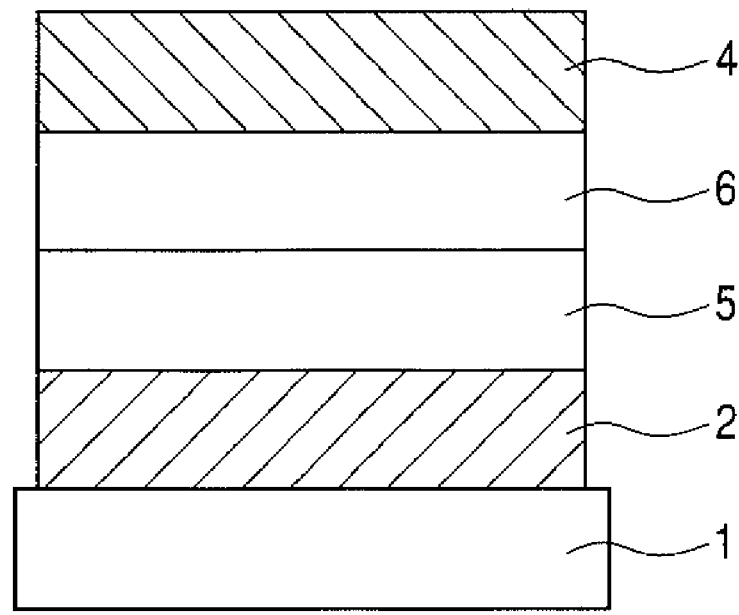
FIG. 2 is a sectional view illustrating another embodiment of the organic luminescent device according to the present invention.

FIG. 2 is a sectional view illustrating another embodiment of the organic electroluminescent device according to the present invention. FIG. 2 illustrates a structure in which an anode 2, a hole transport layer 5, an electron transport layer 6 and a cathode 4 are formed in this order on a substrate 1. In this case, the organic electroluminescent device is useful in the case where a material having one of hole transport properties, electron transport properties and both of these properties is used in respective layers as a luminescent substance in combination with a hole transport material or an electron transport material having no luminescent properties. In this case, a luminescent layer 3 includes either the hole transport layer 5 or the electron transport layer 6.

Figure 3:
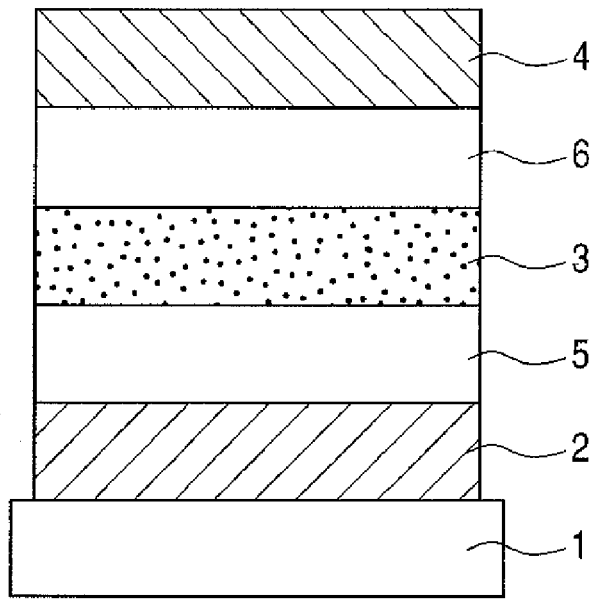
FIG. 3 is a sectional view illustrating another embodiment of the organic luminescent device according to the present invention.

FIG. 3 is a sectional view illustrating another embodiment of the organic luminescent device according to the present invention. FIG. 3 illustrates a structure in which an anode 2, a hole transport layer 5, a luminescent layer 3, an electron transport layer 6 and a cathode 4 are formed in this order on a substrate 1. In this structure, carrier transport function is separated from luminescent function. This structure uses compounds having the properties of hole transport properties, electron transport properties and luminescent properties in combination. This significantly increases the flexibility of selecting materials and allows the use of various compounds having different luminescence wavelengths. As a result, it is possible to diversify the luminescent hue. Furthermore, an increase in luminous efficiency may be ensured by effectively enclosing one of carriers and excitons in the middle luminescent layer 3.

Figure 4:
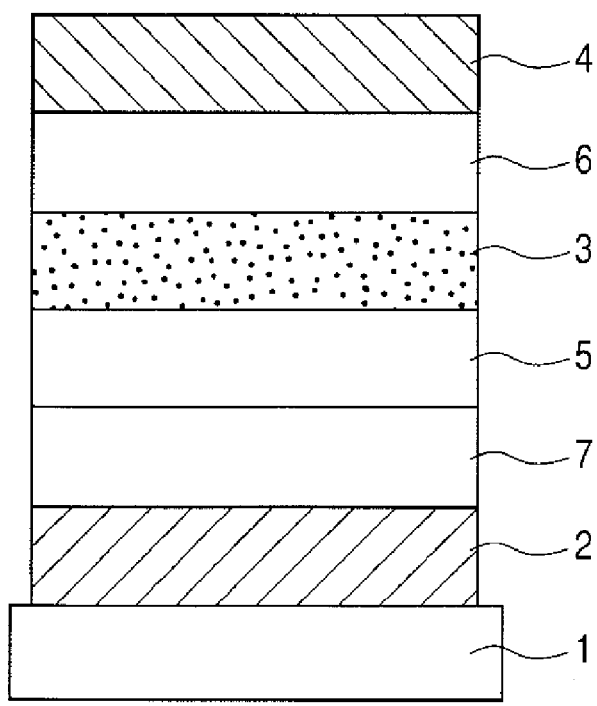
FIG. 4 is a sectional view illustrating another embodiment of the organic luminescent device according to the present invention.
Figure 5:
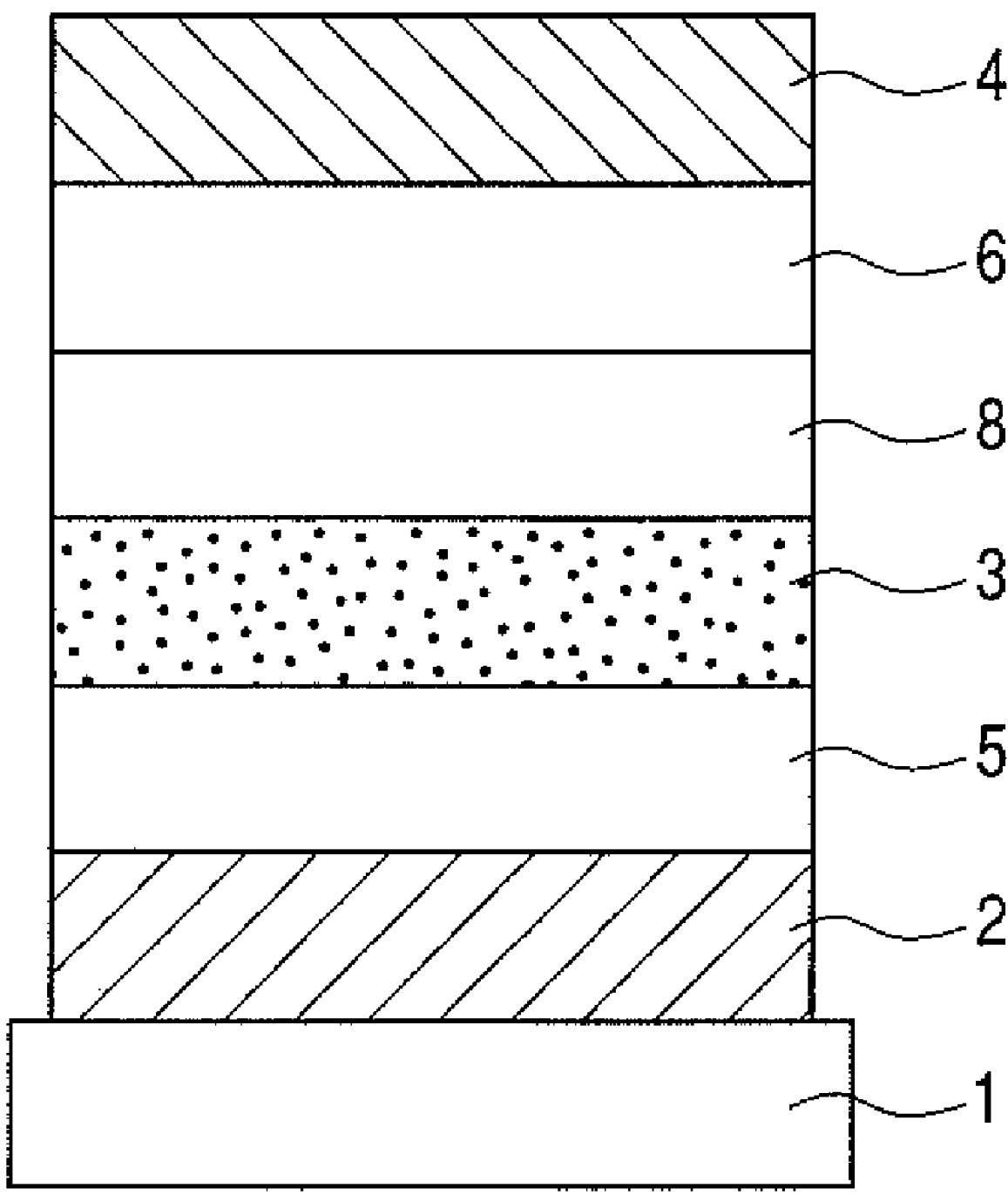
FIG. 5 is a sectional view illustrating another embodiment of the organic luminescent device according to the present invention.

FIG. 4 is a sectional view illustrating another embodiment of the organic luminescent device according to the present invention. FIG. 4 illustrates a structure which is the same as that in FIG. 3 except that a hole injection layer 7 is interposed between the hole transport layer 5 and the anode 2. This structure is effective in improving adhesion between the anode 2 and the hole transport layer 5 or improving hole injection properties, which in turn is effective in a reduction in device voltage.

Next, materials composing respective layers will be exemplified below for each of the layers:

(Hole Injection/Transport Material)

A positive hole (hole) injection/transport material preferably has excellent mobility to facilitate the injection of holes from the anode and to transport the injected holes to the luminescent layer. Low-molecular and high-molecular materials having hole injection/transport properties include, but are not limited to, triarylamine derivatives, phenylenediamine derivatives, triazole derivatives, oxadiazole derivatives, imidazole derivatives, pyrazoline derivatives, pyrazolone derivatives, oxazole derivatives, fluorenone derivatives, hydrazone derivatives, stilbene derivatives, phthalocyanine derivatives, porphyrin derivatives, polyvinylcarbazoles, polysilylenes, polythiophenes and other conductive polymers. Some specific examples of these materials are shown below.

Low-Molecular Hole Injection/Transport Materials

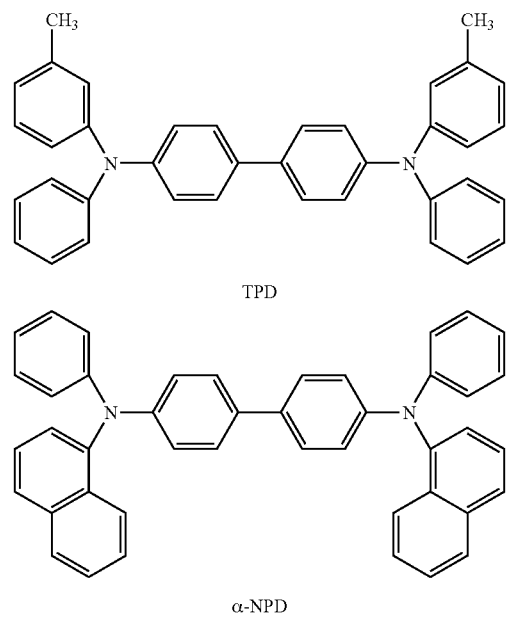

-continued
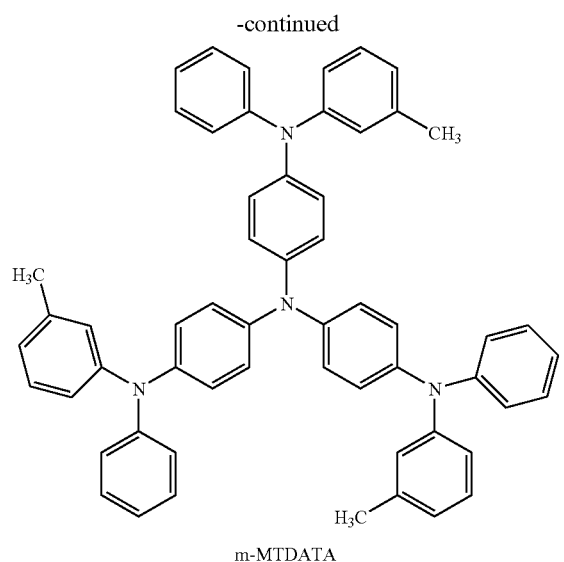
m-MTDATA
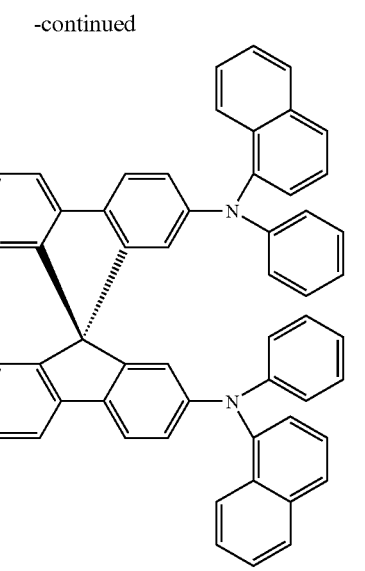
spiro-NPD
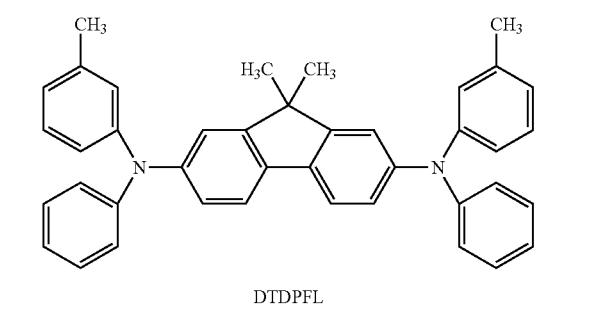
DTDPFL
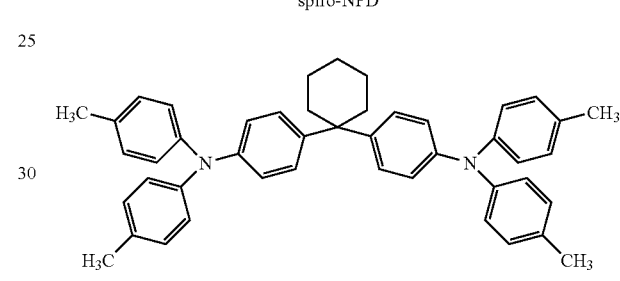
TPAC
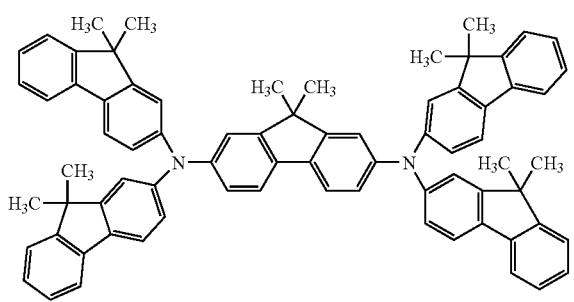
TFLFL
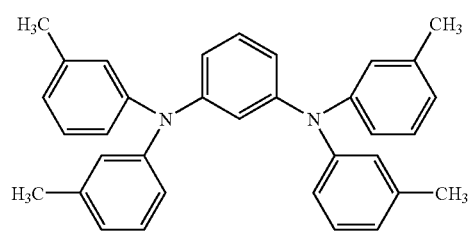
PDA
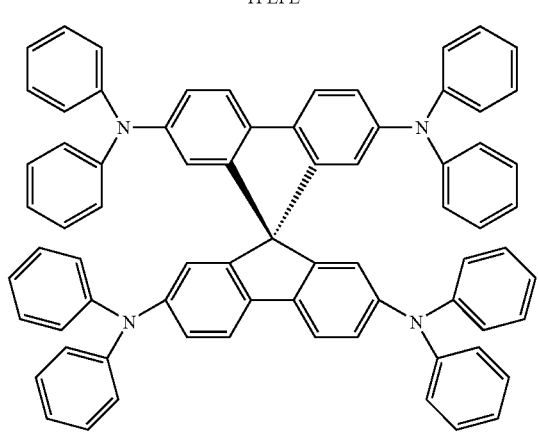
spiro-TPD
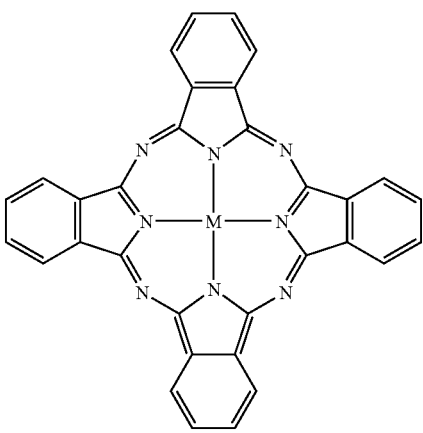
Pc-M
M: Cu, Mg, AlCl, TiO, SiCl2, Zn, Sn, MnCl, GaCl, etc High-Molecular Hole Transport Materials
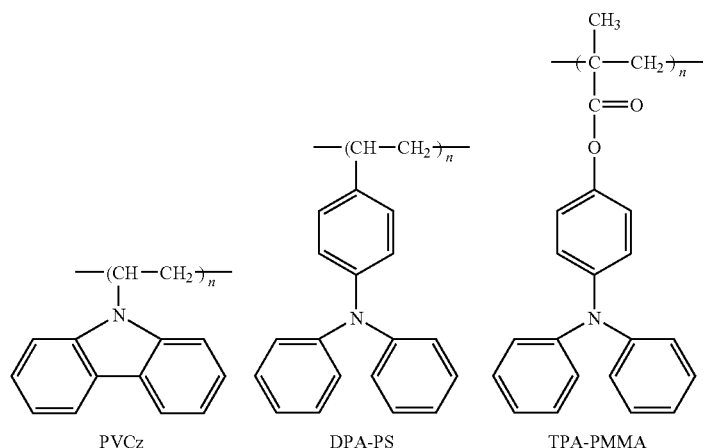
PVCz  DPA-PS  TPA-PMMA
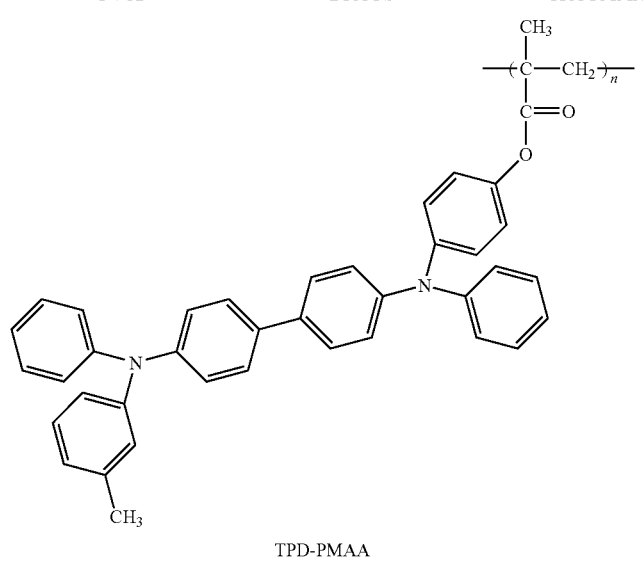
TPD-PMAA
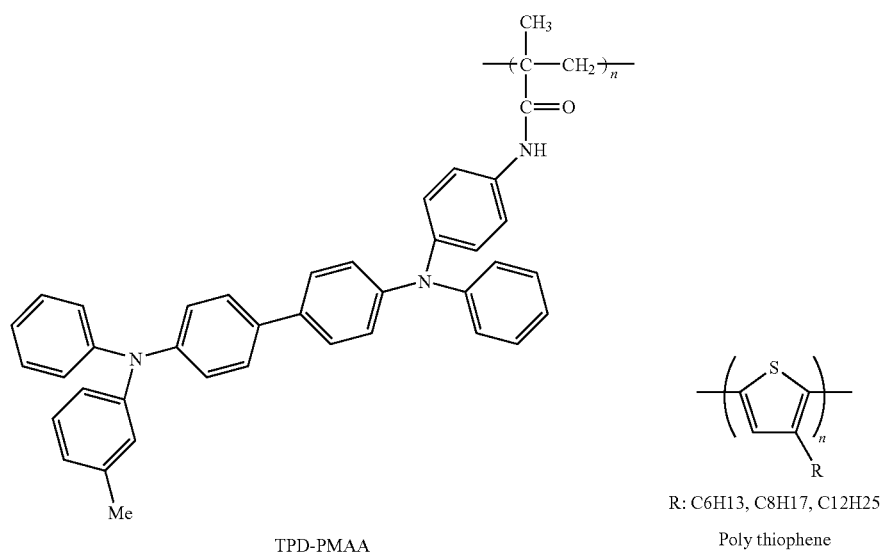
TPD-PMAA
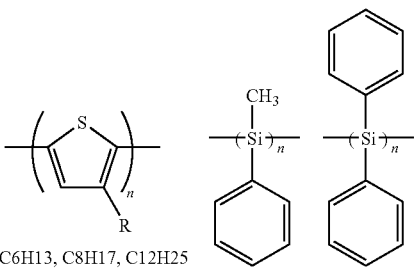
R: C6H13, C8H17, C12H25
Poly thiophene  Polysilane

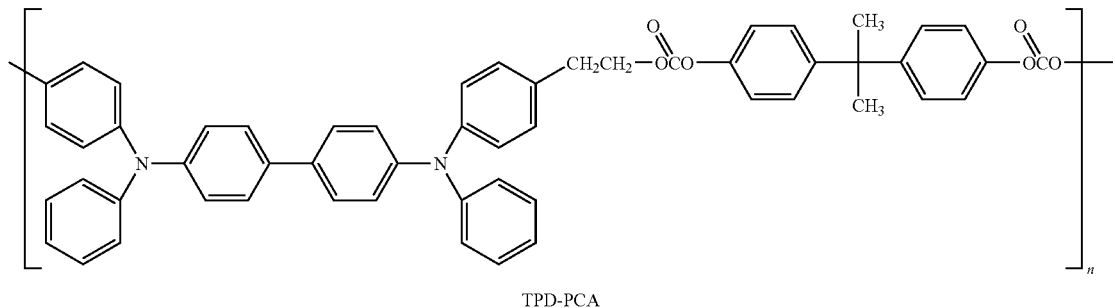
TPD-PCA (Luminescent Layer)

In the present invention, the luminescent layer includes Alq3 (8-hydroxyquinoline aluminum) and TPP (5,10,15,20-tetraphenyl-21H,23H-porphine) as its components.

Alq3 is used as a host material, and TPP is used as a dopant material of a luminescent layer.

In the luminescent layer, known low-molecular or polymeric hole transport compounds, luminescent compounds or electron transport compounds can also be used together, if necessary.

Examples of materials mainly involved in luminescent function include, but are not limited to, polycyclic condensed aromatic compounds (including naphthalene derivatives, phenanthrene derivatives, fluorene derivatives, pyrene derivatives, tetracene derivatives, coronene derivatives, chrysene derivatives, perylene derivatives, 9,10-diphenylanthracene derivatives and rubrene); quinacridone derivatives; acridone derivatives; coumarin derivatives; pyran derivatives; Nile red; pyrazine derivatives; benzoimidazole derivatives; benzothiazole derivatives; benzoxazole derivatives; stilbene derivatives; organometallic complexes (including organic aluminum complexes such as tris(8-quinolinolato)aluminum and organic beryllium complexes); and high-molecular derivatives such as poly(phenylene vinylene) derivatives, poly(fluorene) derivatives, poly(phenylene) derivatives, poly(thienylene vinylene) derivatives and poly(acetylene) derivatives. Some of the specific examples will be shown below.

DPVBi, PESB, EM2, Spiro-TAD, Zn(BOX)2 and Spiro-8Φ show blue luminescence; Bebq2, Alq3 and Tb(acac)3 show green luminescence; and Rubrene, Eu(TTFA)3Phen, TPP, DCM and BPPC show red luminescence.

Low-Molecular Luminescent Material

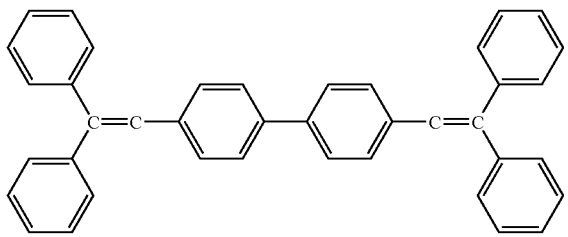
DPVBi

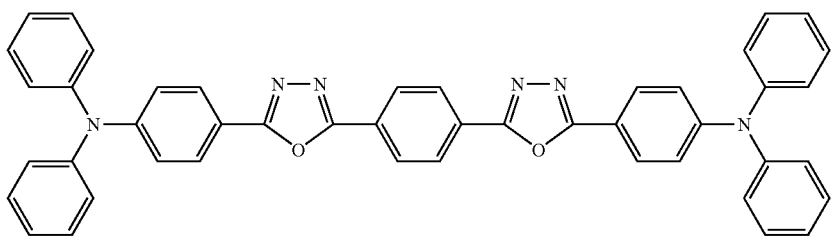
EM2

-continued
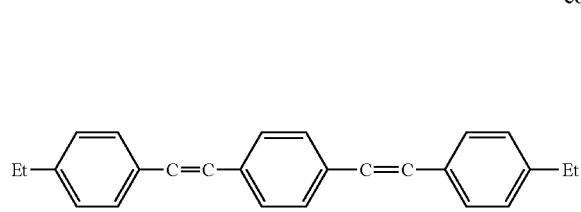
PESB
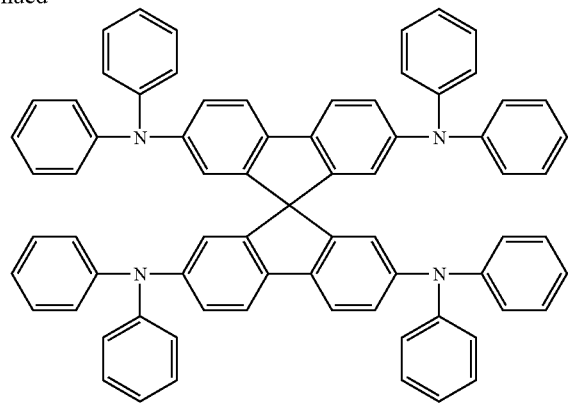
Spiro-TAD
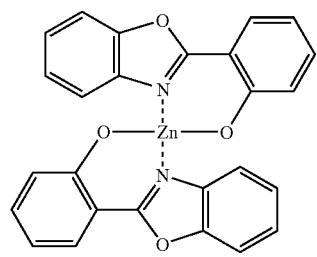
Zn (BOX)₂
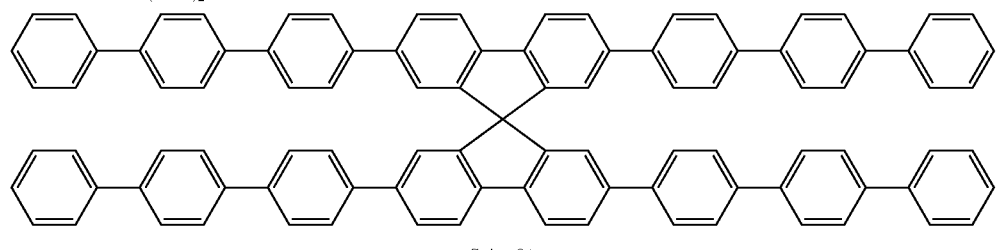
Spiro-8φ
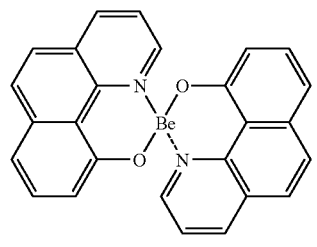
Bebq₂
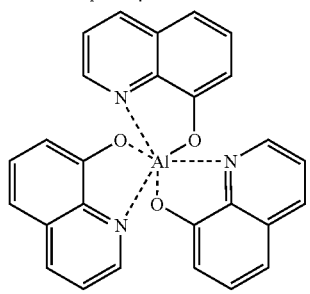
Alq₃
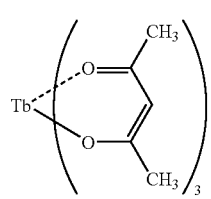
Tb(acac)₃
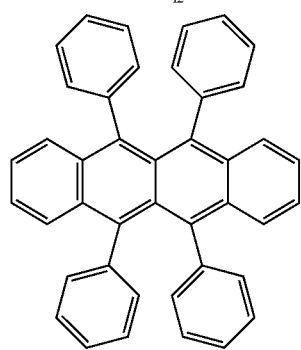
Rubrene
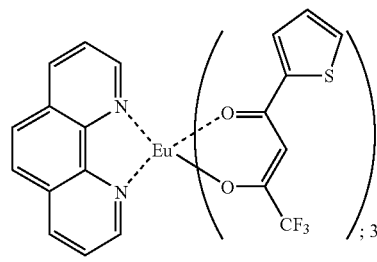
Eu (TTFA)₃Phen
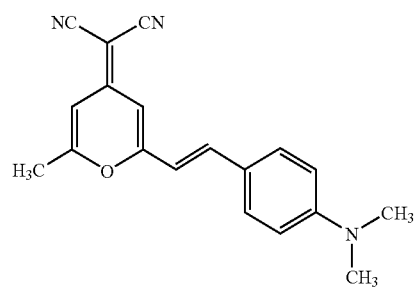
DCM

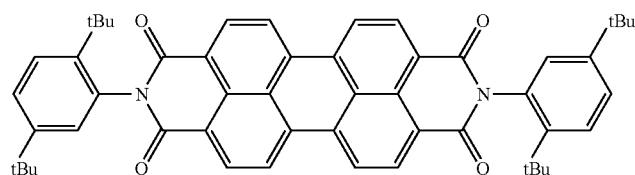
BPPC
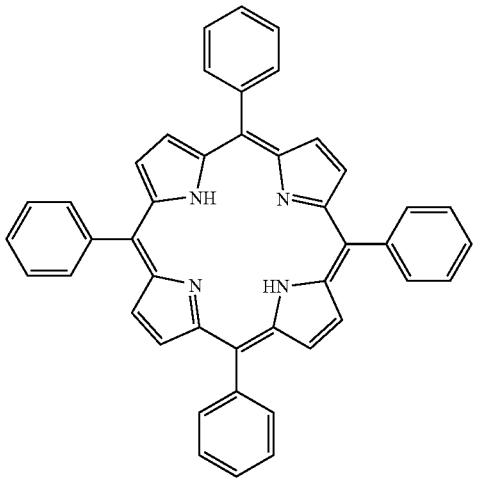
TTP
High-Molecular Luminescent Material
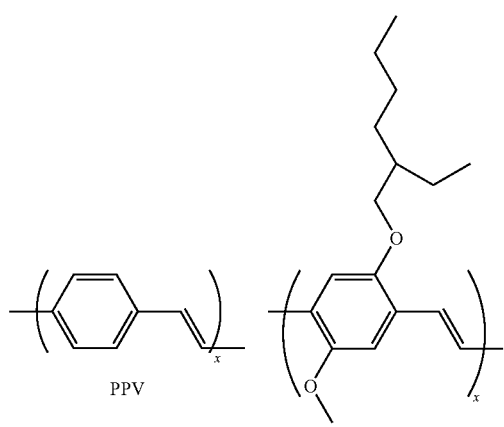
PPV
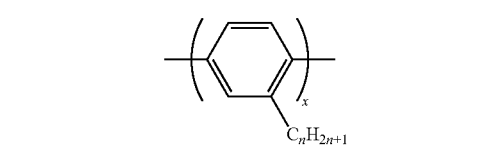
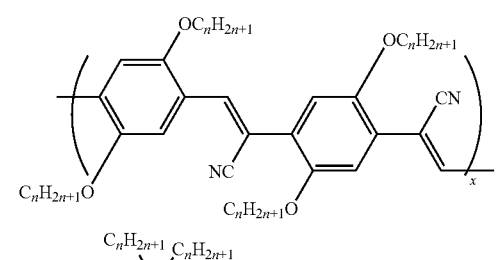
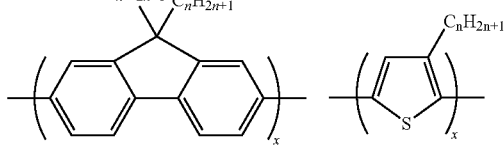
-continued
Metal Complex Luminescent Material
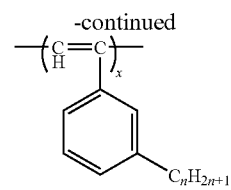
Alq
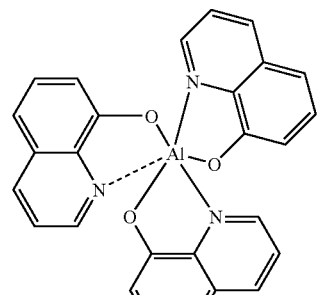
BeBq
(Electron Injection/Transport Material)
An electron injection/transport material may be optionally selected from materials which facilitate the injection of electrons from the cathode and have a function of transporting the injected electrons to the luminescent layer. The material is selected in consideration of the balance with the carrier mobility of a hole transport material. Examples of the materials having electron injection/transport properties include, but are not limited to, oxadiazole derivatives, oxazole derivatives, thiazole derivatives, thiadiazole derivatives, pyrazine derivatives, triazole derivatives, triazine derivatives, perylene derivatives, quinoline derivatives, quinoxaline derivatives, fluorenone derivatives, anthrone derivatives, phenanthroline derivatives and organometallic complexes. Some specific examples are shown below.

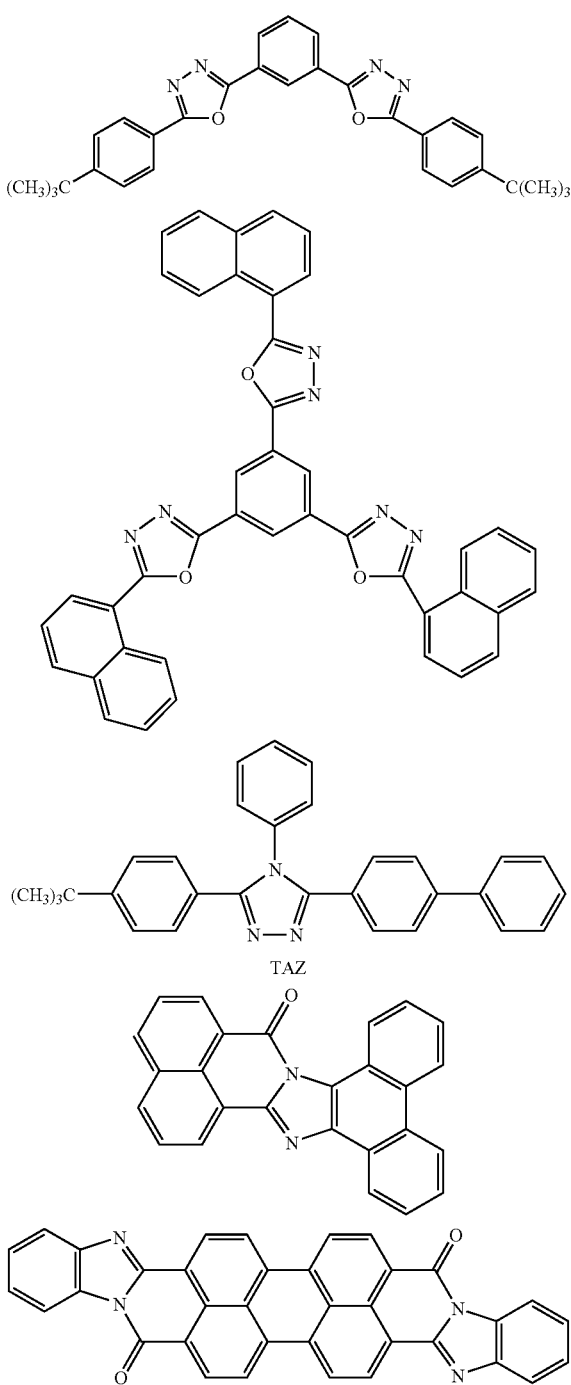

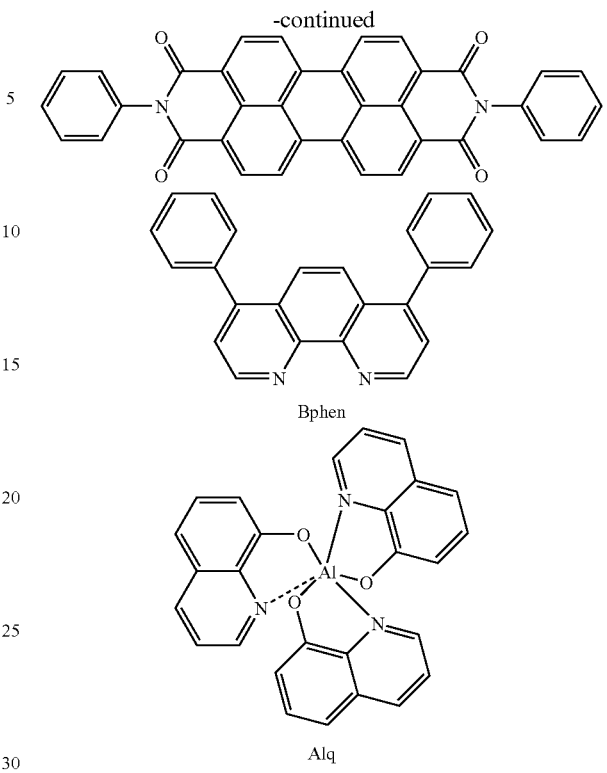

(Anode Material and a Cathode Material)

An anode material preferably has as high a work function as possible, and examples of such a material include metal elements such as gold, platinum, silver, copper, nickel, palladium, cobalt, selenium, vanadium and tungsten; alloys of these metals; and metal oxides such as tin oxide, zinc oxide, indium oxide, indium tin oxide (ITO) and indium zinc oxide. Further, conductive polymers such as polyanilines, polypyrroles, polythiophenes and polyphenylene sulfides may also be used. These electrode substances may be used singly or in combination. Further, the anode may have one of a single-layer structure and a multilayer structure.

The anode may be formed by any procedures as far as it can be prepared, but when an inert gas is introduced into the anode, a procedure similar to that for preparing the luminescent layer can be adopted. Specifically, it is a procedure for keeping the partial pressure of the inert gas in a film deposition environment at a constant pressure or a procedure for ionizing the inert gas to co-deposit it.

On the other hand, a cathode material preferably has as low a work function as possible, and examples of such a material include metal elements such as lithium, sodium, potassium, calcium, magnesium, aluminum, indium, ruthenium, titanium, manganese, yttrium, silver, lead, tin and chromium; and multiple alloys such as lithium-indium, sodium-potassium, magnesium-silver, aluminum-lithium, aluminum-magnesium and magnesium-indium. Metal oxides such as indium tin oxide (ITO) may also be used. These electrode substances may be used singly or in combination. Further, the cathode may have one of a single-layer structure and a multilayer structure.

In addition, at least one of the anode and cathode is desirably transparent or translucent.

The anode may be formed by any procedures as far as it can be prepared, but when an inert gas is introduced into the cathode, a procedure similar to that for preparing the anode can be adopted.

(Substrate)

Substrates which can be used in the present invention include, but are not limited to, opaque substrates such as metallic substrates and ceramic substrates; and transparent substrates such as glass, quartz and plastic sheets. Further, a color filter film, a fluorescent color conversion filter film, a dielectric reflection film or the like can be used as a substrate to control a luminescent color. In addition, it is also possible to provide a thin film transistor (TFT) on the substrate and form a device by connecting thereto.

Further, as to the direction for extracting light from a device, any one of a bottom emission configuration (configuration in which light is extracted from a substrate side) and a top emission configuration (configuration in which light is extracted from the side opposite to a substrate) may be adopted.

A produced device may also be provided with a protective layer or a sealing layer to prevent contact with oxygen or moisture. Examples of the protective layer include diamond thin films; films of inorganic materials such as metal oxides and metal nitrides; films of polymers such as fluororesins, poly-p-xylenes, polyethylene, silicone resins and polystyrene resins; and photocurable resins. Further, the produced device may also be covered with one of glass, a gas-impermeable film and a metal, followed by packaging it with a suitable sealing resin.

EXAMPLES

The present invention will be now described in more detail below with reference to examples, but the present invention is not limited to the examples.

Example 1

There was prepared a transparent conductive support substrate having a film of indium tin oxide (ITO) with a thickness of 120 nm as an anode 2 deposited on a glass substrate 1 by a sputtering method. The substrate was ultrasonically cleaned sequentially with acetone and isopropyl alcohol (IPA), followed by cleaning with boiled IPA and drying. The dried substrate was further cleaned with UV/ozone and used as the transparent conductive support substrate.

TPD as a hole transport material was deposited by vacuum deposition to form a film having a thickness of 15 nm. As for the conditions for vapor deposition, the degree of vacuum was $1.0 \times 10^{-4}$ Pa, and the film deposition rate was from 0.2 nm/sec to 0.3 nm/sec.

The hole transport layer 5 formed had a thickness of 11 nm. Next, Alq3 and TPP were co-deposited as a luminescent layer 3 on the hole transport layer 5. TPP was doped so that it is present in an amount of about 1 mol % of Alq3 to provide the luminescent layer 3 having a thickness of about 20 nm. As for the conditions for vapor deposition, the degree of vacuum was $1.0 \times 10^{-4}$ Pa, and the film deposition rate was from 0.2 nm/sec to 0.3 nm/sec. At the same time, the surface of the substrate was irradiated with ion beams accelerated to 0.5 kV from an Ar ion gun to introduce Ar into the organic film. The amount of the ion beam current was about 1 µA. The ion gun was of a differential exhaust type. Further, bathophenanthroline (BPhen) was deposited by a vacuum deposition method to form an electron transport layer 6 having a thickness of 40 nm. As for the conditions for vapor deposition, the degree of vacuum was $1.0 \times 10^{-4}$ Pa, and the film deposition rate was from 0.2 nm/sec to 0.3 nm/sec.

Next, a metal layer having a thickness of 0.5 nm was formed on the above described organic layer by a vacuum deposition method, using a deposition material including an aluminum-lithium alloy (lithium concentration of 1 atom %). Further, an aluminum film having a thickness of 150 nm was formed on the metal layer by a vacuum deposition method. Thus, there was prepared an organic luminescent device having an aluminum-lithium alloy film as an electron injection electrode (cathode 4). As for the conditions for vapor deposition, the degree of vacuum was $1.0 \times 10^{-4}$ Pa, and the film deposition rate was from 1.0 nm/sec to 1.2 nm/sec.

The resulting organic electroluminescent device was covered with a protective glass plate in a dry air atmosphere and sealed with an acrylic resin adhesive so that the device was not degraded by adsorbing moisture.

A voltage of 4.0 V was applied to the thus obtained device using the ITO electrode (anode 2) as a positive electrode and the Al electrode (cathode 4) as a negative electrode. As a result, there was observed emission of red light having a center wavelength of 660 nm at a luminous brightness of 480 cd/m² with a luminous efficiency of 2.2 lm/W.

Furthermore, a voltage was applied to the device for 100 hours in nitrogen atmosphere while keeping the current density at 30 mA/cm². As a result, the initial brightness of 490 cd/m² was reduced to a brightness of 395 cd/m² after 100 hours, which means only a small reduction in brightness.

Although Ar was used in the present example, similar results will be obtained when one of krypton, xenon and radon is used.

A thin film having a thickness of 20 nm was formed on a glass plate, wherein the film including the same organic materials as those used for the above described luminescent layer was formed on the glass plate in the same conditions as those used for forming the luminescent layer. The surface of the thin film was analyzed by XPS. The presence of Ar was determined by the detection of the Ar-2p spectrum. The area ratio of the Ar-2p spectrum to the C-1s spectrum, Ar-2p/C-1s, is about 0.03, which indicates that Ar is contained at a concentration of about 1%.

Comparative Example 1

A device was prepared in the same manner as in Example 1 except that a luminescent layer was prepared without introducing Ar. There was observed emission of red light of 660 nm at a luminous brightness of 350 cd/m² with a luminous efficiency of 1.61 lm/W.

Furthermore, a voltage was applied to the device for 100 hours in nitrogen atmosphere while keeping the current density at 30 mA/cm². As a result, the initial brightness of 450 cd/m² was reduced to a brightness of 160 cd/m² after 100 hours, which means a large reduction in brightness.

Example 2

A device was prepared in the same manner as in Example 1 using the same substrate, organic materials and electrode materials as used in Example 1 except that, when the luminescent layer is irradiated with Ar ions during the deposition thereof, the amount of the ion current was varied from 2 to 0.5 µA so that a non-uniform distribution of Ar concentration is obtained in the luminescent layer.

The resulting organic electroluminescent device was covered with a protective glass plate in a dry air atmosphere and sealed with an acrylic resin adhesive so that the device was not degraded by adsorbing moisture.

A voltage of 4.0 V was applied to the thus obtained device using the ITO electrode (anode 2) as a positive electrode and the Al electrode (cathode 4) as a negative electrode. As a result, there was observed emission of red light having a center wavelength of 660 nm at a luminous brightness of 480 cd/m$^2$ with a luminous efficiency of 2.2 lm/W.

Furthermore, a voltage was applied to the device for 100 hours in nitrogen atmosphere while keeping the current density at 30 mA/cm$^2$. As a result, the initial brightness of 490 cd/m$^2$ was reduced to a brightness of 420 cd/m$^2$ after 100 hours, which means a smaller reduction in brightness than in Example 1.

Example 3

A device was prepared in the same manner as in Example 1 using the same substrate, organic materials and electrode materials as used in Example 1 except that, when the electron transport layer is deposited, the layer was simultaneously irradiated with ionized Ar to introduce Ar into the electron transport layer. The conditions for irradiation were chosen so that the ion current would be 2 μA and the Ar concentration in the electron transport layer was higher than the Ar concentration in the luminescent layer.

The resulting organic electroluminescent device was covered with a protective glass plate in a dry air atmosphere and sealed with an acrylic resin adhesive so that the device was not degraded by adsorbing moisture.

A voltage of 4.0 V was applied to the thus obtained device using the ITO electrode (anode 2) as a positive electrode and the Al electrode (cathode 4) as a negative electrode. As a result, there was observed emission of red light having a center wavelength of 660 nm at a luminous brightness of 480 cd/m$^2$ with a luminous efficiency of 2.2 lm/W.

Furthermore, a voltage was applied to the device for 100 hours in nitrogen atmosphere while keeping the current density at 30 mA/cm$^2$. As a result, the initial brightness of 490 cd/m$^2$ was reduced to a brightness of 450 cd/m$^2$ after 100 hours, which means a smaller reduction in brightness than in Example 1.

In the present example, Ar was introduced into the electron transfer layer, but the reduction in brightness can be suppressed even when Ar is introduced into the hole transport layer.

Example 4

A device was prepared in the same manner as in Example 3 using the same substrate, organic materials and electrode materials as used in Example 3 except that, when the electrode including an aluminum-lithium alloy as a cathode is prepared, irradiation of ionized Ar was simultaneously conducted to introduce Ar into the electrode. The conditions for irradiation were chosen so that the ion current would be 2 μA.

The resulting organic electroluminescent device was covered with a protective glass plate in a dry air atmosphere and sealed with an acrylic resin adhesive so that the device was not degraded by adsorbing moisture.

A voltage of 4.0 V was applied to the thus obtained device using the ITO electrode (anode 2) as a positive electrode and the Al electrode (cathode 4) as a negative electrode. As a result, there was observed emission of red light having a center wavelength of 660 nm at a luminous brightness of 480 cd/m$^2$ with a luminous efficiency of 2.2 lm/W.

Furthermore, a voltage was applied to the device for 100 hours in nitrogen atmosphere while keeping the current density at 30 mA/cm$^2$. As a result, the initial brightness of 490 cd/m$^2$ was reduced to a brightness of 450 cd/m$^2$ after 100 hours, which means a smaller reduction in brightness than in Example 1. The result was similar to that in Example 3.

Example 5

A device was prepared in the same manner as in Example 4 using the same substrate, organic materials and electrode materials as used in Example 4.

The resulting organic electroluminescent device was covered with a protective glass plate and sealed with an acrylic resin adhesive so that the device was not degraded by adsorbing moisture. At this time, the sealing was performed in an atmosphere having 100% of a high purity (99.995%) Ar gas.

A voltage of 4.0 V was applied to the thus obtained device using the ITO electrode (anode 2) as a positive electrode and the Al electrode (cathode 4) as a negative electrode. As a result, there was observed emission of red light having a center wavelength of 660 nm at a luminous brightness of 480 cd/m$^2$ with a luminous efficiency of 2.2 lm/W.

Furthermore, a voltage was applied to the device for 200 hours in nitrogen atmosphere while keeping the current density at 30 mA/cm$^2$. As a result, the initial brightness of 490 cd/m$^2$ was reduced to a brightness of 390 cd/m$^2$ after 200 hours, which means a smaller reduction in brightness than in Example 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-094555, filed Mar. 30, 2006, which is hereby incorporated by reference herein in its entirety.

What is claimed is:

1. An organic electroluminescent device comprising, in sequence: an anode, a hole transport layer, a luminescent layer, an electron transport layer and a cathode, wherein the luminescent layer contains an organic compound and at least one element A selected from the group consisting of argon, krypton, xenon and radon, wherein the electron transport layer contains an organic compound and at least one element B selected from the group consisting of argon, krypton, xenon and radon, and wherein the concentration of the at least one element B in the electron transport layer is higher than that of the at least one element A in the luminescent layer.

2. The organic electroluminescent device according to claim 1, wherein the element A has a concentration distribution in a depth direction of the luminescent layer.

3. The organic electroluminescent device according to claim 1, wherein the element A is present in an amount of 0.01 atom % or more and of 5 atom % or less in the luminescent layer.

4. The organic electroluminescent device according to claim 1, wherein the anode and the cathode each contain at least one element A.

5. A display apparatus comprising the organic electroluminescent device according to claim 1 in a display portion.

6. The display apparatus according to claim 5, further comprising a holding unit for holding the display portion in an airtight state, wherein the holding unit has an airtight space containing at least one element A.

7. The organic electroluminescent device according to claim 1, wherein the at least one element B in the electron transport layer is the same as the at least one element A in the luminescent layer.

8. The organic electroluminescent device according to claim 7, wherein the at least one element A and the at least one element B is argon.

* * * * *